(12) United States Patent
Kariya

(10) Patent No.: US 6,440,542 B1
(45) Date of Patent: Aug. 27, 2002

(54) COPPER-CLAD LAMINATED BOARD, AND CIRCUIT BOARD FOR PRINTED WIRING BOARD AND METHOD FOR PRODUCING THE SAME

(75) Inventor: Takashi Kariya, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/889,569

(22) PCT Filed: Dec. 4, 2000

(86) PCT No.: PCT/JP00/08585

§ 371 (c)(1),
(2), (4) Date: Jul. 30, 2001

(87) PCT Pub. No.: WO01/42006

PCT Pub. Date: Jun. 14, 2001

(30) Foreign Application Priority Data

Dec. 8, 1999 (JP) .............................. 11-348407

(51) Int. Cl.⁷ .................................................. B32B 3/00
(52) U.S. Cl. ........................ 428/209; 174/259; 174/262; 428/901
(58) Field of Search ................................ 428/209, 901; 174/259, 262

(56) References Cited

U.S. PATENT DOCUMENTS 4,619,871 A * 10/1986 Takami ........................ 428/607
6,107,003 A * 8/2000 Kuwako ....................... 430/314
6,212,769 B1 * 4/2001 Boyko et al. ................... 427/97

FOREIGN PATENT DOCUMENTS

| JP | 3-222388 | 10/1991 |
| JP | 9-365551 | 2/1997 |
| JP | 11-10794 | 1/1999 |

OTHER PUBLICATIONS

English Language Abstract of JP 9–36551 (No Date).
English Language Abstract of JP 11–10794 (No Date).
English Language Abstract of JP 3–222388 (No Date).

* cited by examiner

Primary Examiner—Cathy Lam
(74) Attorney, Agent, or Firm—Greenblum & Bernstein, P.L.C.

(57) ABSTRACT

A copper-clad laminate is provided which includes an insulative substrate having laminated on one or either side thereof a copper foil whose one side is roughened, the copper foil having formed on the roughened surface side thereof a metal layer whose melting point is lower than that of zinc. There is also provided a circuit board for a printed wiring board, including an insulative substrate having a conductive circuit formed on one side thereof and viaholes formed in through-holes extending from the other side of the insulative substrate to the conductive circuit, there being formed between the one side of the insulative substrate and the conductive circuit a metal layer whose melting point is lower than that of zinc. No desmearing is required in making the circuit board, and so a circuit board for a multilayer printed wiring board can be produced which is superior in stability of the inter-layer electrical connection.

10 Claims, 3 Drawing Sheets

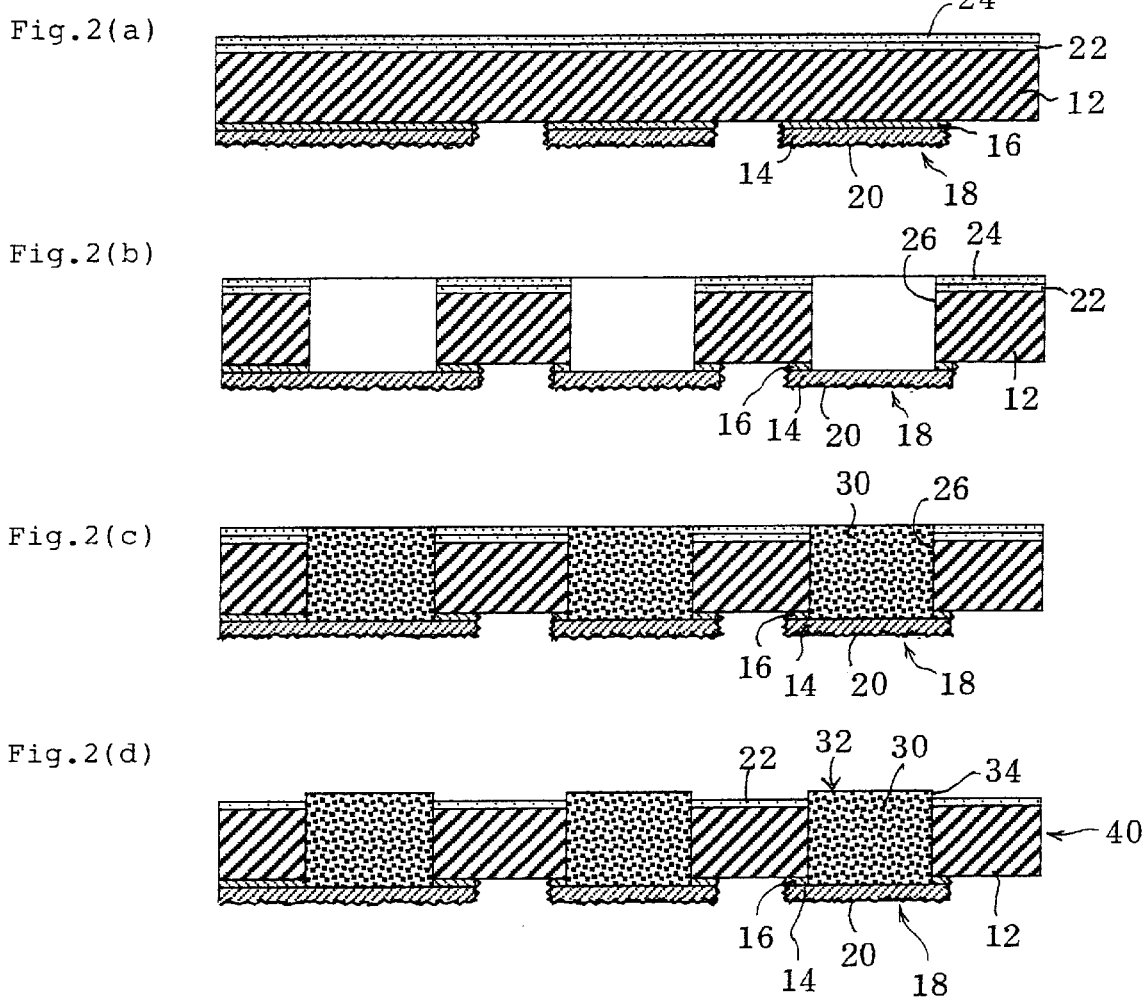

COPPER-CLAD LAMINATED BOARD, AND CIRCUIT BOARD FOR PRINTED WIRING BOARD AND METHOD FOR PRODUCING THE SAME

TECHNICAL FIELD

The present invention relates to a copper-clad laminate including an insulative substrate having a copper foil laminated thereto, a circuit board for a printed wiring board incorporating the copper-clad laminate, and method for producing the circuit board.

BACKGROUND ART

For a high adhesion between the copper foil and resin and better rust prevention, the copper-clad laminate for use to produce a printed wiring board is normally subjected at the copper foil surface thereof to a surface roughening or a surface processing such as coating of zinc or the lie. For example, when a multilayer printed wiring board is produced using the copper-clad laminate, the copper foil surface is etched to form a conductive circuit, through-holes are formed as extended from the resin surface opposite to the copper foil to the conductive circuit by laser irradiation, and further a conductive substance is filled in each through-hole to form a viahole. A plurality of such circuit boards is stacked one on the other with an adhesive layer being laid between them, and they are hot—pressed together to produce a multilayer printed wiring board having an IVH structure. Such multilayer printed wiring board and a method for production thereof are disclosed in the Japanese Patent Application No. 7-139878 of the Application of the present invention.

To form the viaholes extending from the resin layer surface to the conductive circuit, the through-holes can be formed very precisely and in a short time by the use of an appropriate laser irradiation. The lasing conditions including a laser output, for forming such through-holes, depends upon the thickness of the resin layer and copper foil, but the laser output is limited to a predetermined range which will not damage the copper foil.

In case the through-hole is formed by the laser drilling, however, smear will remain on the inner wall surface of the through-hole. After through-holes are formed, they have to be desmeared by a chemical processing or plasma processing. The smearing residue on the entire bottom of the through-hole was examined and analyzed. The analysis result proved that a part of zinc applied to the matted or mat-finished surface of the copper foil for the purpose of improving the adhesion to the resin layer surface cannot completely be evaporated under the predetermined lasing conditions but it is melted to be integral with the resin fibers and adheres to the entire bottom of the through-holes.

Accordingly, the present invention has a main object to overcome the above-mentioned drawbacks of the prior art by providing a copper-clad laminate which can be produced without having to desmear a through-holes for viaholes.

The present invention also has an object to provide a circuit board for a printed wiring board, in which a copper-clad laminate producible without having to desmear through-holes for viaholes, and a method for production of the circuit board.

DISCLOSURE OF THE INVENTION

To attain the above objects, the inventors of the present invention had made many experiments and found that a metal layer whose melting point is lower than that of zinc and almost all of which are evaporated under the predetermined lasing conditions can be formed on a roughened side, that is, a mat-finished surface, of a copper foil. Based on the above findings, the inventors of the present invention provide the following inventions:

(1) A copper-clad laminate including an insulative substrate having laminated on one or either side thereof a copper foil whose one side is roughened, the copper foil having formed on the roughened surface side thereof a metal layer whose melting point is lower than that of zinc.

(2) A circuit board for a printed wiring board, including an insulative substrate having a conductive circuit formed on one side thereof and viaholes formed in through-holes extending from the other side of the insulative substrate to the conductive circuit, there being formed between the one side of the insulative substrate and the conductive circuit a metal layer whose melting point is lower than that of zinc.

In the above copper-clad laminate (1) and circuit board (2), the metal layer lower in melting point than zinc should preferably be formed from a solder containing tin as a main component such as a lead-tin solder, silver-tin solder, bismuth-tin solder or the like and having a thickness of 0.1 to 2.0 $\mu$m.

(3) A method for producing a circuit board for a printed wiring board, including an insulative substrate having a conductive circuit formed on one side thereof and viaholes formed in through-holes extending from the other side of the insulative substrate to the conductive circuit and in which there is formed between the one side of the insulative substrate and the conductive circuit a metal layer whose melting point is lower than that of zinc, the method including the following steps (a) to (d):

(a) roughening one side of a copper foil and then forming, on the roughened surface, a metal layer whose melting point is lower than that of the roughened surface of the copper foil;

(b) laminating the copper foil at the side thereof on which the metal layer is formed to one side of the insulative substrate;

(c) etching the copper foil attached to the insulative substrate to form the conductive circuit; and (d) forming through-holes extending from the other side of the insulative substrate to the conductive circuit by lasing and then forming viaholes in the through-hole.

(4) A method for producing a circuit board for a printed wiring board, including an insulative substrate having a conductive circuit formed on one side thereof and a viahole formed in through-holes extending from the other side of the insulative substrate to the conductive circuit and in which there is formed between the one side of the insulative substrate and the conductive circuit a metal layer whose melting point is lower than that of zinc, the method including the following steps (a) to (d):

(a) forming a low melting point metal layer on one side of the insulative substrate by the PVD or CVD method or electroless plating;

(b) making an electrolytic copper plating to the insulative substrate having the low melting point metal layer formed thereon to provide a conductive circuit having a copper plated layer formed on the low melting point metal layer;

(c) etching the conductive layer to the conductive circuit on one side of the insulative substrate; and (d) forming through-holes extending from the other side of the insulative substrate to the conductive circuit by lasing and then forming filled-viaholes in the through-holes.

In the above methods (3) and (4), the viahole should preferably be formed by filing a conductive substance in the through-hole.

These objects and other objects, features and advantages of the present invention will become more apparent from the following detailed description of the best modes for carrying out the present invention when taken in conjunction with the accompanying drawings.

BRIEF DESCRIPTION OF THE DRAWINGS

FIGS. 2(a)–2(d) show some of steps taken in producing a single-sided circuit board for a multilayer printed wiring board by the method according to the present invention.

BEST MODE FOR CARRYING OUT THE INVENTION

Figure 1A:
FIGS. 1(a)–1(e) show some of steps taken in producing a single-sided circuit board for a multilayer printed wiring board by the method according to the present invention.

According to the present invention, the copper-clad laminate having formed on one roughened side of a copper foil attached to one or either side of an insulative substrate, a metal layer which replaces zinc used in the prior art and whose melting temperature is lower than that of zinc.

Because of this construction of the copper-clad laminate, in case a through-hole extending from one side of the insulative substrate to the other side having the metal layer formed thereon is formed by lasing, almost all of the low melting point metal layer at the bottom of the through-hole is evaporated while a part of the low melting point metal layer at the periphery of the through-hole is not evaporated but melted and moves along with the residual resin pieces to the edge of the through-hole. Hence, there is no substantial requirement for desmearing the through-hole.

According to the present invention, the insulative substrate may be made of a hard resin which can be lased. For example, it may be made of glass fabric-epoxy resin, glass fabric-bismaleimide-triazine (BT) resin, glass fabric-polyphenylene ether resin, nonwoven aramide fabric-epoxy resin, nonwoven aramide fabric-polyimide resin or the like. Also, it may be made of a resin containing no glass fabric or nonwoven aramide fabric.

Especially, the insulative substrate should preferably be made of an epoxy resin and more preferably of glass fabric-epoxy resin of 20 to 200 $\mu$m in thickness. The reason why the substrate thickness is limited to the above range is that a thickness of less than 20 $\mu$m will result in a lower reliability of the insulative substrate while a thickness of more than 200 $\mu$m will make it difficult to form an opening for a viahole and also result in an increased thickness of the insulative substrate itself.

Also, according to the present invention, the copper foil has the one side thereof mat-finished for an improved adhesion thereof to the resin, and a metal layer whose melting point is lower than that of zinc is formed on the mat-finished surface.

The copper foil should desirably have a thickness of 5 to 18 $\mu$m because if the copper foil is too thin, the laser will penetrate through the copper foil when it is tried to form openings for viaholes in the insulative substrate by lasing while if the copper foil is too thick, it is difficult to form a fine pattern by etching.

Further, the metal layer whose melting point is lower than that of zinc should desirably be formed from a solder containing tin as a main component such as a tin-lead, tin-silver solder, tin-bismuth solder or the like. It should desirably be formed on the mat-finished surface of the copper foil to a thickness of 0.1 to 2.0 $\mu$m by sputtering such as PVD or CVD method or plating.

The reason for the above is that when the metal layer is less than 0.1 $\mu$m thick, it will be melted by the lasing but to an amount not sufficient to move the smearing residue of the resin to the periphery of the viahole bottom while a thickness of more than 2.0 $\mu$m will smoothen the roughened surface of the copper foil and thus result in an insufficient adhesion to the insulative substrate.

For the production of a copper-clad laminate by laminating a copper foil to an insulative substrate, it should preferably be done by hot pressing with a semi-cured resin adhesive layer being laid between the copper foil and insulative substrate. The hot pressing is made at a proper temperature and under an appropriate pressure. More preferably, the lamination should be done under a reduced pressure to cure only the semi-cured resin adhesive layer, whereby the copper foil can securely be bonded to the insulative substrate.

According to the present invention, the circuit board for a printed wiring board can be produced using a copper-clad laminate including an insulative substrate having a copper foil laminated to one side thereof.

More specifically, the copper-clad laminate according to the present invention is formed by roughening one side of a copper foil, then forming a metal layer whose melting point is lower than that of zinc on the roughened surface of the copper foil by the PVD method, CVD method or electroless plating, and laminating the copper foil at the metal layer side thereof to one side of an insulative substrate.

The conductive circuit in the circuit board for a printed wiring board according to the present invention is formed by etching the copper foil in the above-mentioned copper-clad laminate, then forming through-holes extending from the other side of the insulative substrate to the conductive circuit by lasing, and forming filled-viaholes in the through-holes.

According to the present invention, the circuit board for a printed wiring board can be produced without using the above copper-clad laminate. In this case, a low melting point metal layer is first formed on one side of an insulative substrate by the PVD method, CVD method or electroless plating, the insulative substrate having the low melting point metal layer formed thereon is subjected to an electrolytic copper plating to form a conductive layer having a copper layer plated on the low melting point metal layer, the conductive layer is etched to form a conductive circuit, then a through-holes extending from the other side of the insulative substrate to the conductive circuit is formed by lasing, and filled-viaholes are formed in the through-holes.

The through-hole for the viahole, formed in the insulative substrate should desirably be formed by lasing with carbon dioxide gas laser, YAG laser or the like.

When the insulative substrate is made of an epoxy resin among others, the through-holes should preferably be formed by lasing with a carbon dioxide gas laser whose pulse energy is 0.5 to 5.0 mJ, pulse width is 1 to 20 μs, pulse spacing is more than 2 ms, number of shots is 3 to 10 and diameter is 50 to 250 μm.

The reason for the above is that when the laser diameter is less than 50 μm, it is difficult to fill a conductive substance in the resulted through-hole and attain a high reliability of inter-layer electrical connection while a laser having a diameter of more than 250 μm can hardly form through-holes at high densities.

To form through-holes with the carbon dioxide gas laser, it is desirable to stick a resin film to one or either side of an insulative substrate with a semi-cured resin adhesive layer being laid between them, and irradiate the laser to the insulative substrate from above the resin film.

The resin adhesive should preferably be made of a bisphenol A epoxy resin and 10 to 50 μm in thickness.

The resin film stuck to the resin adhesive layer serves as a mask when a conductive paste is filled into the through-holes for viaholes and is separable from the adhesive layer after the viahole is formed in the insulative substrate.

The conductive substance which is filled into the through-hole penetrating the insulative substrate should preferably be a conductive paste or a metal plating layer which is formed by electrolytic plating, of which the conductive paste is more preferable for simplifying the process, reducing the manufacturing costs and improving the yield.

The circuit board having such a conductive circuit formed on either side of the insulative substrate is suitably usable as a core board in forming a multilayer printed wiring board. Preferably, a via-land (pad) having a diameter of 50 to 250 μm should be formed as a part of the conductive circuit on the side of the substrate corresponding to each viahole.

The circuit board having the conductive circuit formed on one side of the insulative substrate is suitably usable as a circuit board for stacked use, and a conductive projection should preferably be formed right on the conductive substance filled in the viahole.

The conductive projection should preferably be formed from a conductive paste or low melting point metal. In the production of a multilayer printed wiring board, since the conductive paste or low melting point metal is thermally deformed in the hot pressing process, a variation in height of the conductive substance filled in the viahole can be accommodated, so that any poor inter-layer electrical connection can be prevented and thus a multilayer printed wiring board having a highly reliable inter-layer electrical connection can be provided.

How a circuit board for a printed wiring board is produced using a copper-clad laminate according to the present invention will be described by way of example with the accompanying drawings.

To produce the wiring board for a printed wiring board according to the present invention, first a copper-clad laminate is produced. This production will first be described. As shown, a copper-clad laminate 10 includes an insulative substrate 12 (see FIG. 1(a)) having a copper foil 14 (see FIG. 1(b)) attached to one side thereof.

Figure 1B:
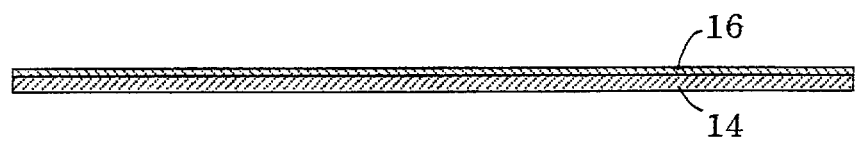
Figure 1C:
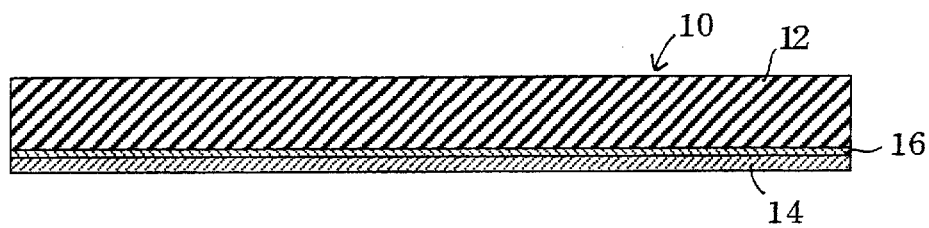

(1) The surface of the side of the insulative substrate 12 to which the copper foil 14 is laminated is roughened to be a so-called mat-finished or matted surface. Further, a low melting point metal layer 16 lower in melting point than zinc is formed on the roughened surface of the copper foil 14 by an appropriate method (as shown in FIG. 1(b)). The copper-clad laminate 10 is formed by stacking such copper foil 14 and insulative substrate 12 and hot pressing of them (as shown in FIG. 1(c)). This process will further be described herebelow.

The insulative substrate 12 should desirably be made of glass fabric-epoxy resin, nonwoven aramide fabric-epoxy resin, nonwoven aramide fabric-polyimide resin, bismaleimide-triazine (BT) resin or the like, for example.

The insulative substrate 12 should desirably be 20 to 100 μm thick in order to assure a sufficient insulation. When the thickness is less than 20 μm, the insulative substrate 12 has no sufficient strength to handle. On the other hand, when the thickness is over 100 μm, it is difficult to form fine through-holes and fill a conductive substance into them.

The one side of the copper foil 14 at which the latter is laminated to the insulative substrate 12 is roughened as in the above for the purpose of improving the adhesion to the resin surface of the insulative substrate 12. The low melting point metal layer 16 whose melting point is lower than that of zinc is formed on the roughened side of the copper foil 14 by the PVD method, CVD method or electroless plating.

The low melting point should desirably be a solder containing tin as a main component such as a tin-lead solder, tin-silver solder or tin-bismuth solder and having a thickness of 0.1 to 2.0 μm.

The copper foil 14 should desirably be 5 to 18 μm in thickness for the reason that when it is thinner than the above range of thickness, the laser which will further be described later will penetrate through the metal layer in forming a through-hole for a viahole in the insulative substrate, while with a larger thickness of the copper foil 14, it is difficult to form a fine pattern by etching.

Figure 1D:
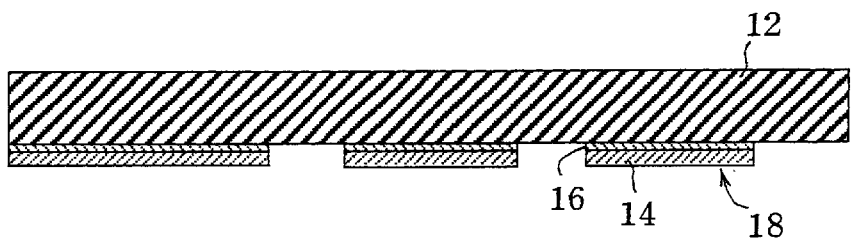

(2) Thereafter, a photosensitive dry film resist is attached to the side of the copper foil 14 at which it is laminated to the insulative substrate 12 or a liquid photosensitive resist is applied to that side of the copper foil 14. The copper foil 14 is exposed through a predetermined circuit pattern and developed to form an etching resist. Then the copper foil 14 is etched at portions thereof having not the etching resist to form a conductive circuit 18 as shown in FIG. 1(d).

The etching reagent or etchant should desirably be at least one selected from aqueous solutions of sulfuric acid-hydrogen peroxide, persulfate, cupric chloride and ferric chloride.

For easy formation of a fine pattern, the entire surface of the copper foil 14 may previously be etched to a thickness of 1 to 10 μm, preferably, to a thickness of 2 to 8 μm before forming the conductive circuit 18.

Also, a conductive circuit may be formed directly on the insulative substrate without using the copper-clad laminate. In this case, a low melting point metal is vapor-deposited on the surface of the insulative substrate 12 to form the metal layer 16, then it is subjected to an electrolytic plating to form a copper plating layer 14, the latter is etched to form the conductive circuit 18.

Figure 1E:
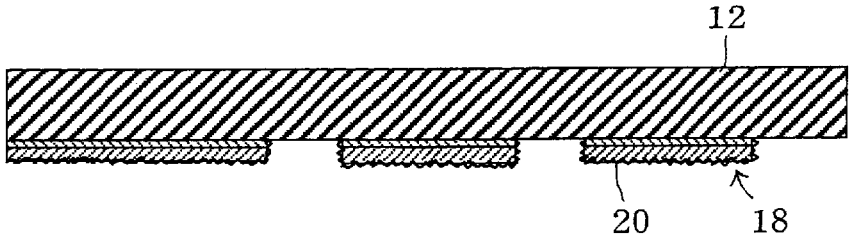

(3) The front and lateral sides of the conductive circuit formed by etching as in the above process (2) are roughened as indicated with a reference 20 as in FIG. 1(e).

This surface roughening is intended to assure an improved adhesion between the conductive circuit 18 and a conductive projection which will further be described later and also for an improved adhesion to the adhesive layer in order to prevent a delamination in stacking and bonding two or more single-sided circuit boards together.

The surface roughening may be done by soft etching, blackening-reduction (oxidation), forming a needle alloy plating of copper-nickel-phosphorus (INTERPLATE by Ebara Yujilite) or using an etchant (MECETCHBOND by Mec).

(4) Next, an adhesive layer 22 is formed on the resin surface of the insulative substrate 12 as in FIG. 2(a).

The adhesive layer 22 is provided to connect adjacent single-sided circuit boards to each other when producing a multilayer printed wiring board by stacking and bonding the single-sided circuit boards together. The adhesive layer 22 is applied to the entire resin surface of the insulative substrate 12. It should be a dried yet-to-be-cured adhesive and should preferably be pre-cured and have a thickness of 20 to 30 μm for easier handling.

The adhesive layer 22 should desirably be of an organic adhesive which is at least a resin selected from epoxy resin, polyimide resin, thermosetting polyphenylene ether (PPE), composite resin of epoxy and thermosetting resins, composite resin of epoxy and silicon resins, and BT resin (bismaleimide-triazine).

The organic adhesive being the yet-to-be-cured resin is applied by curtain coating, spin coating, roll coating, spray coating or screen printing. The adhesive layer can also be formed by laminating an adhesive sheet.

(5) Further, a protective film 24 is laminated on the adhesive layer 22 formed in the above process (4) as shown in FIG. 2(a), and laser is irradiated from above the protective layer 24 to the assembled layers to form a through-hole 26 extending through the protective film 24, adhesive layer 22 and insulative substrate 12 to the conductive circuit 18 and which will be finished as a viahole, as shown in FIG. 2(b).

The protective film 24 is used as a printing mask for a conductive paste which will further be described later. It may be a film of polyethylene terephthalate (PET) having an adhesive layer provided on the surface thereof, for example. In the PET film 24, the thickness of the adhesive layer is 1 to 20 μm and the thickness of itself is 10 to 50 μm, for example.

The through-holes are formed by drilling with a laser beam from a pulse oscillation type carbon dioxide gas laser beam machine. The laser should desirably be a one whose pulse energy is 0.5 to 5.0 mJ, pulse width is 1 to 20 μs, pulse spacing is more than 2 ms and number of shots is 3 to 10.

The through-holes 26 formed under the above conditions should desirably have a diameter of 50 to 250 μm.

To remove resin pieces remaining on the inner wall of the through-hole 26, desmearing by a oxygen plasma discharge or corona discharge should desirably be used for assuring the reliability of the inter-layer electrical connection. According to the present invention, however, almost all the low melting point metal layer at the bottom of the through-hole is evaporated by the laser irradiation with a part of the low melting point metal layer at the periphery of the through-hole not completely be evaporated but moving along with the remaining resin pieces to the edge of the through-hole. Thus, there is no substantial requirement for desmearing the through-hole.

(6) Next, a conductive paste 30 is filled into the laser beam-drilled through-hole 26 for a viahole as shown in FIG. 2(c).

The conductive paste 30 is filled in almost all the opening formed through the PET film 24, opening formed through the adhesive layer 22 and through-hole 26 formed through the insulative substrate 12.

The conductive paste 30 may be made of particles of at least one selected from silver, copper, gold, nickel and solder.

The metal particle may have a different metal coated on the surface thereof. More specifically, the metal particle may be a copper particle coated with a precious metal selected from gold and silver.

The conductive paste should desirably be an organic one including metal particles to which a thermosetting resin such as epoxy resin or phenol resin and/or a thermoplastic resin such as polyphenylene sulfide (PPS) are added.

The conductive substance may be filled in the through-hole by printing a solder paste whose melting point is low, plating with a solder or dipping the assembled layers in a molten solder instead of filling the conductive paste, and the low melting point metal may be a lead-tin solder, silver-tin solver or an indium solder.

(7) Thereafter, the protective film 24 is delaminated from on the adhesive layer 22 as shown in FIG. 2(d).

By delaminating the protective film 24, viaholes 32 for connection to the Conductive circuit 18 are formed in the through-holes 26 and there is provided a circuit board 40 having conductive projections (bump) 34 projecting from the surface of the insulative substrate 12 by a total of the thickness of the adhesive layer 22 and that of the PET film 24.

Two or more aforementioned circuit boards according to the present invention are stacked on one another and bonded to each other or stacked and bonded to a previously produced core board to provide a multilayer printed wiring board.

How a multilayer printed wiring board is formed by stacking multiple, for example, four, circuit boards each produced through the above processes (1) to (7) on one another, will be described by way of example herebelow with reference to FIGS. 3 and 4.

Figure 3:
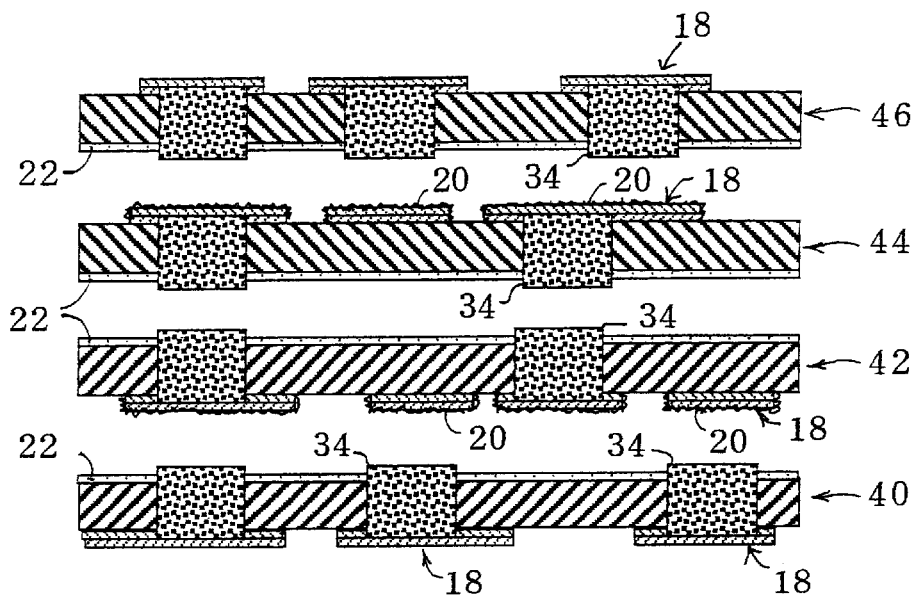
FIG. 3 shows some of steps taken in producing a four-layer printed wiring board using single-sided circuit boards produced by the method according to the present invention.

First, single-sided circuit boards 40, 42, 44 and 46 are positioned for stacking on one another for the conductive projection 34 of one of the adjacent single-sided circuit boards and the conductive circuit 18 of the other circuit board, or for the conductive projections 34 of the adjacent circuit boards, to be opposite to each other as shown in FIG. 3. That is, this positioning is made with guide pins (not shown) inserted through guide holes formed in the edges of the single-sided circuit boards. Also, this positioning may be done with CCD camera.

Figure 4:
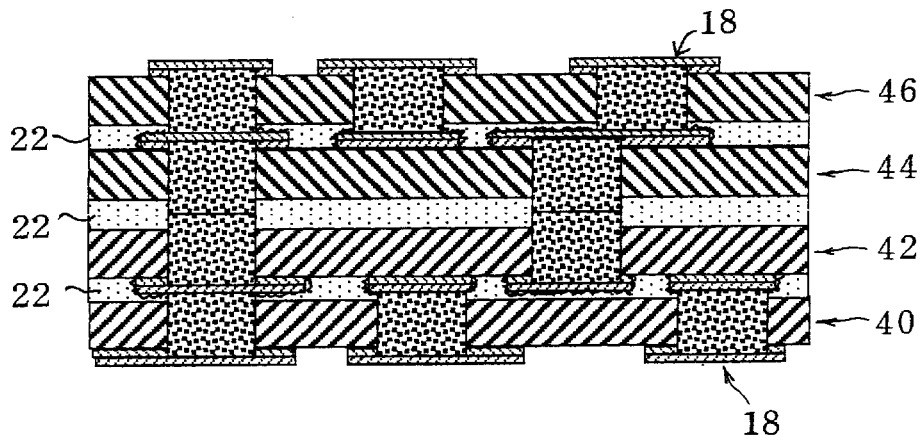
FIG. 4 shows the four-layer wiring board formed by stacking and bonding together the single-sided circuit boards produced by the method according to the present invention.

The four circuit boards 40 to 46 stacked as in the above are hot pressed at a temperature of 150 to 200° C. by a hot press and subjected to a single hot pressing under a pressure of 0.5 to 10 MPa, or more desirably, under a pressure of 2 to 5 MPa, to provide an integral multilayer printed wiring board as shown in FIG. 4. Note that this hat pressing should preferably be effected under a reduced pressure.

When the single-sided circuit boards are thus pressed together, the conductive projections 34 of the circuit board 40 abut, and is thus electrically connected to, the conductive circuit 18 of the circuit board 42. Similarly, the conductive projections 34 of the single-sided circuit board 42 abut, and is thus electrically connected to, the conductive projections 34 of the circuit board 44, and the conductive projections 34 of the circuit board 46 abut, and is thus electrically connected to the conductive circuit 18 of the circuit board 44.

Further, owing to the simultaneous pressing and heating, the adhesive layers 22 previously provided in the single-sided circuit boards 40 to 46 are cured to assure a strong bonding between the adjacent circuit boards. Note that in this best mode for carrying out the present invention, the adhesive layer 22 is pre-coated to the entire resin surface of the insulative substrate 12 and preliminarily cured, to which however the present invention is not limited and that the adhesive layer 22 may be provided during stacking of the single-sided circuit boards on each other.

The stacked four single-sided circuit boards are heated and pressed together as in the above so that the conductive projections 34 of each single-sided circuit board are connected to the conductive circuit 18 or conductive projections 34 of the single-sided circuit board opposite to the counterpart, thereby producing an integral multilayer printed wiring board.

In this best mode for carrying out the present invention, the four single-sided circuit boards according to the present invention are used to provide the integral multilayer printed wiring board. However, the number of single-sided circuit boards used for a multilayer printed wiring board is not limited to this number but any number of, for example, three, five or six, such circuit boards may be used to provide a multilayer printed wiring board having a corresponding number of layers. Further, the single-sided printed wiring board may of course be stacked and bonded on a conventional single-sided printed circuit board, double-sided printed circuit board, double-seed through-hole printed circuit board or multilayer printed circuit board to produce a multilayer printed wiring board.

EXAMPLE 1

(1) A low melting point metal layer of a lead-tin solder and 0.5 μm in thickness was plated on one side of a 12 μm-thick copper foil which had been roughened or matted.

(2) The copper foil formed in the step (1) above was attached at the low melting point metal layer thereof to a 75 μm-thick hard resin substrate of glass fabric-epoxy resin by host pressing to prepare a single-sided copper-clad laminate.

(3) A photosensitive dry film resist was attached to the copper foil of the single sided copper-clad laminate prepared as in the step (2) above, exposed through a predetermined circuit pattern and developed to form an etching resist, and then the copper foil on which the etching resist was not formed was etched with an etchant of cupric chloride to form a conductive circuit of 12 μm in thickness.

(4) The front and lateral sides of the conductive circuit formed as in the step (3) above were roughened with an etchant "MECETCHBOND (by Mec)" for example.

(5) On the other hand, a 25 μm-thick adhesive layer of epoxy resin was formed on the resin surface of the single-sided copper-clad laminate, and pre-cured for easier handling.

(6) The PET film having an adhesive layer of 10 μm in thickness and whose thickness is 12 μm was laminated on the adhesive layer formed in the step (5) above, and then through-holes for viaholes (blind via) were formed using a pulse oscillation type carbon dioxide gas laser.

(7) A conductive paste of silver powder and thermosetting epoxy resin was filled in each through-hole, formed by the lasing to form a viahole.

(8) The PET film was peeled off the adhesive layer and the entire conductive paste was pre-cured to form a circuit board having the conductive circuit on the one side of the single-sided copper-clad laminate, the viaholes formed through itself extending through the resin layer from the other side of the laminate to the conductive layer, and the conductive projections (bump) formed right on the viaholes.

(9) (Four such single-sided circuit boards thus formed were stacked in place and bonded together by pressing at a temperature of 180° C. for 70 minutes by a vacuum hot press to produce a four-layer wiring board of IVH structure.

In the four-layer printed wiring board thus produced, L/S=75 μm/75 μm, land diameter was 250 μm, viahole diameter was 150 μm, conductive layer thickness was 12 μm arid insulative layer thickness was 75 μm.

In the present invention, it is essential to form a metal layer whose melting point is loser than that of zinc on one side of a copper foil, attach the copper foil at the low melting point metal layer thereof to one side of a rigid insulative layer of glass fabric epoxy resin by hot pressing, irradiate pulse oscillation type carbon dioxide gas laser to the insulative substrate from above the resin surface of the latter to form a good micro a in the glass fabric-epoxy resin substrate which shows a large difference in pyrolytic temperature, and fill a conductive paste into the microvia to form a viahole.

In this best mode for carrying out the present invention, a high-peak, short-pulse oscillation type carbon dioxide gas laser machine (made by Mitsubishi Electric) is used to irradiate pulsed laser beam, by the mask imaging method, from the PET film side to the single-sided copper clad laminate of the glass fabric-epoxy resin having a 22 μm-thick PET film laminated on the resin surface thereof and whose copper foil thickness is 12 μm and substrate thickness is 75 μm, thereby forming a blind via of 150 μm in diameter at a speed 100 holes/sec.

EXAMPLE 2

There was produced a four-layer printed wiring board similar to the aforementioned example 1 except that the low melting point metal was a lead-tin solder of 1.0 μm in thickness.

EXAMPLE 3

There was produced a four-layer printed wiring board similar to the aforementioned example 1 except that the low melting point metal was a silver-tin solder of 0.5 μm in thickness.

EXAMPLE 4

There was produced a four-layer printed wiring board similar to the aforementioned example 1 except that the low melting point metal was a bismuth-tin solder of 0.5 μm in thickness.

COMPARATIVE EXAMPLE 1

There was produced a four-layer printed wiring board similar to the aforementioned example 1 except that a single-sided copper-clad laminate was used which had attached thereto a copper foil having no low melting point metal layer forced thereon.

The examples 1, 2 and 3, and comparative example, of four-layer printed wiring board were examined, by the SEM photographic observation, as to the smear distribution at the bottom of the through-hole for a viahole.

As the results of the SEM photographic observations, it was proved that in each of the examples 1, 2 and 3, almost all the low melting point metal layer was evaporated by the laser beam irradiation and only a small amount of the metal layer not completely evaporated but remaining near the edge of the through-hole bottom was combined with the resin fibers and that in the comparative example 1, zinc not completely evaporated remained as a smear combined with the resin fibers on the entire through-hole.

INDUSTRIAL APPLICABILITY

As having been described in the foregoing, since the low melting point metal layer is for ed between the insulative substrate and copper foil in the copper-clad laminate according to the present invention, when the through-holes extending from one side of the insulative substrate to the other side of the latter on which the copper foil is laminated as a conductive circuit is formed by lasing, almost all the low melting point metal layer at the through-hole bottom is evaporated but a part of the low melting point metal layer at the periphery of the through-hole is not completely evaporated but melted and moves along with the remaining resin pieces to the edge of the through-hole, so that it is possible to produce a circuit board for which there is no substantial requirement for desmearing.

By stacking and bonding two or more such circuit boards according to the present invention it is possible to produce a multilayer printed wiring board which is superior in stability of the inter-layer electrical connection.

What is claimed is:

1. A copper-clad laminate comprising an insulative substrate having laminated on one or either side thereof a copper foil whose one side is roughened, the copper foil having formed on the roughened surface side thereof a metal layer whose melting point is lower than that of zinc.

2. A copper-clad laminate comprising an insulative substrate having laminated on one or either side thereof a copper foil whose one side is roughened, the copper foil having formed on the roughened surface side thereof a metal layer whose melting point is lower than that of zinc, and wherein the metal layer is formed from a solder containing tin as a main component.

3. The copper-clad laminate according to claim 2, wherein the metal layer of the tin-based solder is 0.1 to 2.0 $\mu$m.

4. A circuit board for a printed wiring board, comprising an insulative substrate having a conductive circuit formed on one side thereof and viaholes formed in through-holes extending from the other side of the insulative substrate to the conductive circuit, there being formed between the one side of the insulative substrate and the conductive circuit a metal layer whose melting point is lower than that of zinc.

5. A circuit board for a printed wiring board, comprising an insulative substrate having a conductive circuit formed on one side thereof and viaholes formed in through-holes extending from the other side of the insulative substrate to the conductive circuit, there being formed between the one side of the insulative substrate and the conductive circuit a metal layer whose melting point is lower than that of zinc, and wherein the metal layer is formed from a solder containing tin as a main component.

6. The circuit board according to claim 5, wherein the metal layer of the tin-based solder is 0.1 to 2.0 $\mu$m.

7. A method for producing a circuit board for a printed wiring board, comprising an insulative substrate having a conductive circuit formed on one side thereof and viaholes formed in through-holes extending from the other side of the insulative substrate to the conductive circuit and in which there is formed between the one side of the insulative substrate and the conductive circuit a metal layer whose melting point is lower than that of zinc, the method comprising at least the following:

(a) roughening one side of a copper foil and then forming, on the roughened surface, a metal layer whose melting point is lower than that of the roughened surface of the copper foil;

(b) laminating the copper foil at the side thereof on which the metal layer is formed to one side of the insulative substrate;

(c) etching the copper foil attached to the insulative substrate to form the conductive circuit;

(d) forming through-holes extending from the other side of the insulative substrate to the conductive circuit by lasing and then forming filled-viaholes in the through-hole.

8. A method for producing a circuit board for a printed wiring board, including insulative substrate having a conductive circuit formed on one side thereof and viaholes formed in through-holes extending from the other side of the insulative substrate to the conductive circuit and in which there is formed between the one side of the insulative substrate and the conductive circuit a metal layer whole melting point is lower than that of zinc, the method comprising at least the following:

(a) forming a low melting point metal layer on one side of the insulative substrate by the PVD or CVD method or electroless plating;

(b) making an electrolytic copper plating to the insulative substrate having the low melting point metal layer formed thereon to provide a conductive circuit having a copper plated layer formed the low melting point metal layer;

(c) etching the conductive layer to the conductive circuit on one side of the insulative substrate; and (d) forming through-holes extending from the other side of the insulative substrate to the conductive circuit by lasing and then forming filled-viaholes in the through-hole.

9. The method according to claim 7, wherein the viahole is formed by filling a conductive substance into the through-hole.

10. The method according to claim 8, wherein the viahole is formed by filling a conductive substance into the through-hole.

* * * * *

UNITED STATES PATENT AND TRADEMARK OFFICE
CERTIFICATE OF CORRECTION

PATENT NO.    : 6,440,542 B1
DATED         : August 27, 2002
INVENTOR(S)   : T. Kariya It is certified that error appears in the above-identified patent and that said Letters Patent is hereby corrected as shown below:

<u>Column 12,</u>
Line 25, after "including" insert -- an --.
Line 39, after "formed" insert -- on --.

Signed and Sealed this

Eighth Day of April, 2003

JAMES E. ROGAN
*Director of the United States Patent and Trademark Office*